(12) United States Patent
Kim

(10) Patent No.: US 7,645,629 B2
(45) Date of Patent: Jan. 12, 2010

(54) FABRICATING CMOS IMAGE SENSOR

(75) Inventor: Jin-Han Kim, Gyeongi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 155 days.

(21) Appl. No.: 11/841,072

(22) Filed: Aug. 20, 2007

(65) Prior Publication Data

US 2008/0048220 A1 Feb. 28, 2008

(30) Foreign Application Priority Data

Aug. 23, 2006 (KR) ...................... 10-2006-0079634

(51) Int. Cl.
*H01L 21/00* (2006.01)
(52) U.S. Cl. .................. 438/60; 257/292; 257/E27.133
(58) Field of Classification Search ...................... 438/60
See application file for complete search history.

(56) References Cited

U.S. PATENT DOCUMENTS

2004/0188728 A1* 9/2004 Grant .......................... 257/292
2007/0023802 A1* 2/2007 Oh et al. ...................... 257/292

* cited by examiner

*Primary Examiner*—Lex Malsawma
*Assistant Examiner*—Kimberly Trice
(74) *Attorney, Agent, or Firm*—Sherr & Vaughn, PLLC

(57) ABSTRACT

A CMOS image sensor and a fabricating method thereof are provided. The method includes forming a nitride layer over a boundary region between a device isolation region and a pixel region, forming a silicide barrier layer in the pixel region and performing a silicide process. A boundary portion of the silicide barrier layer formed in the pixel region can be prevented from being wet-etched while the silicide barrier layer is removed by the wet etching process.

13 Claims, 9 Drawing Sheets

FABRICATING CMOS IMAGE SENSOR

The present application claims priority under 35 U.S.C. 119 to Korean Patent Application No. 10-2006-0079634 (filed on Aug. 23, 2006), which is hereby incorporated by reference in its entirety.

BACKGROUND

The present disclosure relates to a complementary metal oxide semiconductor (CMOS) image sensor and a fabrication method thereof. More particularly, a boundary region of a silicide barrier layer of a pixel region in a CMOS image sensor may be protected from wet etching by using a nitride layer. The performance of the CMOS image sensor may be improved, as well as the fabricating method thereof.

CMOS image sensors convert an optical signal into an electric signal. A CMOS image sensor includes a pixel region, which is responsive to an optical signal, and a periphery region, which is not responsive to an optical signal. The pixel region may be isolated from the periphery region by a device isolation region. The device isolation region may be formed using a shallow trench isolation (STI) process. In an STI process, a trench may be formed by etching a semiconductor substrate. The trench may be then filled with a dielectric material. The dielectric fill material may be planarized to form the device isolation region.

A silicide process in which metal atoms are diffused into a silicon substrate to reduce contact resistance may be used in the fabrication of the CMOS image sensor. The silicide may be formed in the periphery region, outside a pixel region in which electricity is generated by the photoelectric effect. Silicide formed in the pixel region may degrade light transmission characteristics and may cause junction leakage in the pixel region, thereby deteriorating electrical characteristics of the device.

Figure 1A:
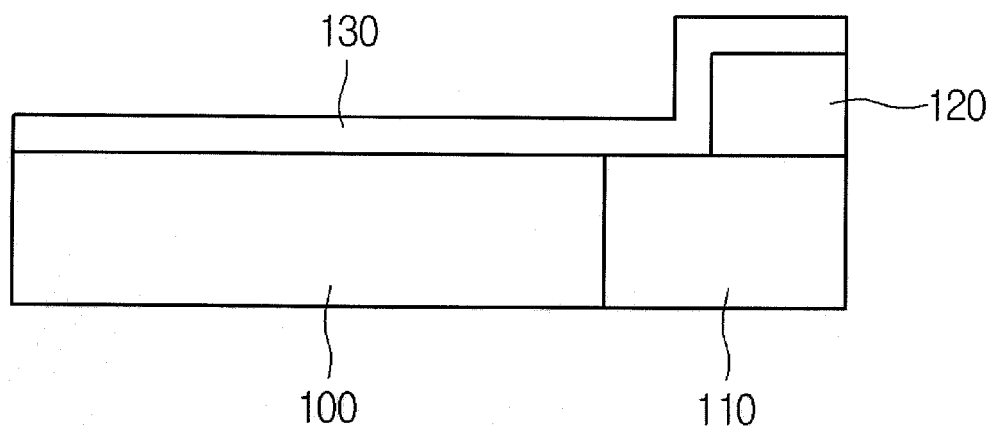

FIGS. 1A to 1D are cross-sectional views illustrating a method for fabricating a related art CMOS image sensor. Referring to FIG. 1A, a nitride layer 130 to be used as a sidewall of a gate electrode is deposited over a semiconductor substrate. A photodiode 100, formed in an active region, includes implanted n-type impurity ions. In a remaining region outside the active region into which the n-type impurity ions are implanted, an additional impurity ion implantation process may be performed before or after the deposition of the nitride layer 130 by adjusting a corresponding photo masking process. A polyline 120 running over a shallow trench isolation (STI) 110 region is shown in FIG. 1A. The polyline 120 may be a select line connected to a select transistor among transistors constituting pixels of a CMOS image sensor.

A silicide barrier layer formed in a pixel region having the polyline 120 of the select transistor therebetween may have a minimized width. This minimized width may cause quality and yield issues related to a silicide barrier layer deposition process.

Figure 1B:
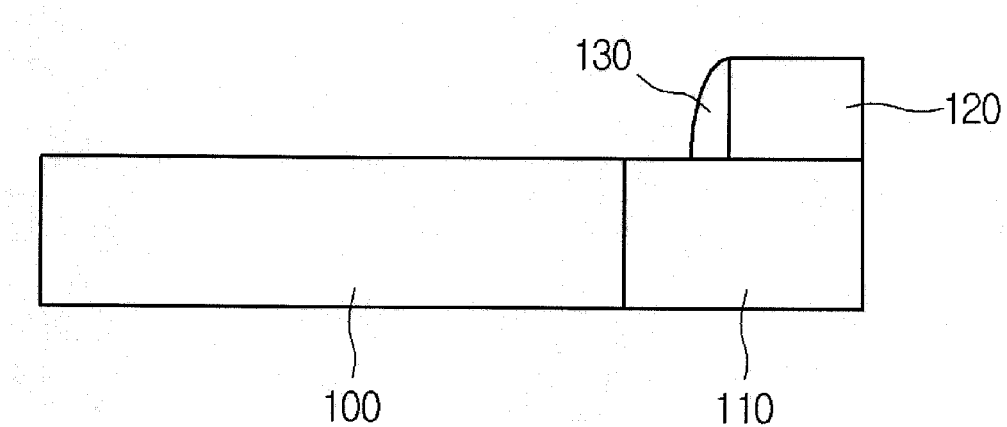
Figure 1C:
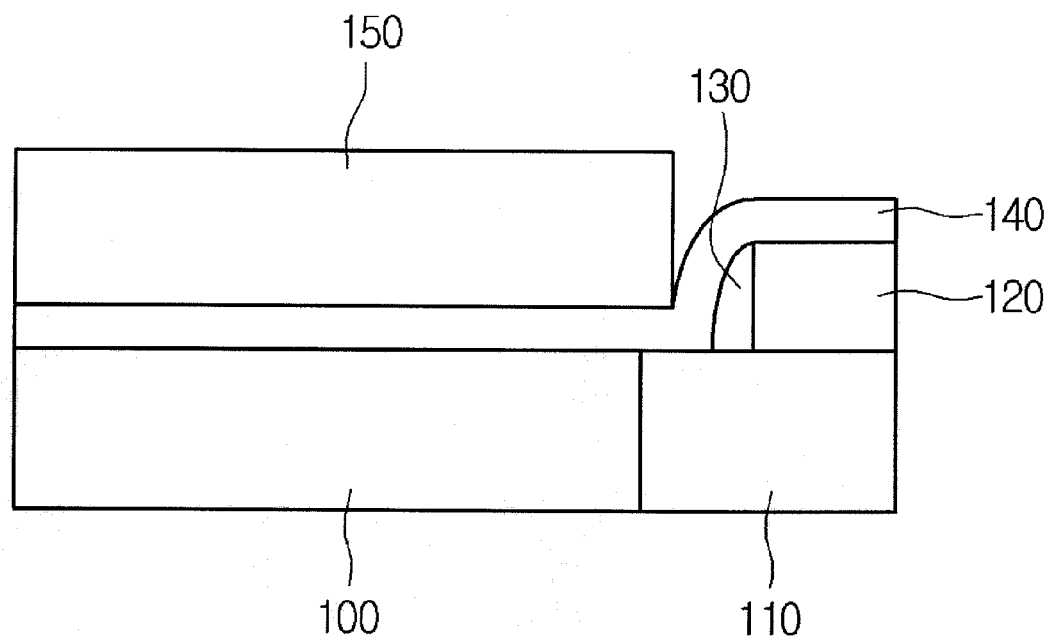

In FIG. 1B, the nitride layer may be etched across the surface without a masking process to form a spacer 130 of the polyline 120. In FIG. 1C, a silicide barrier layer 140 is deposited, a photoresist layer 150 is formed, and a photolithography process is performed. The silicide barrier layer 140 may be formed by depositing tetraethylorthosilicate (TEOS) oxide using a low pressure chemical vapor deposition (LPCVD) or a plasma enhanced chemical vapor deposition (PECVD). The photoresist 150 coated over the silicide barrier layer 140 may be formed to overlap the STI region 110 by 0.2 μm from a boundary between the STI region 110 and the pixel region 100.

Figure 1D:
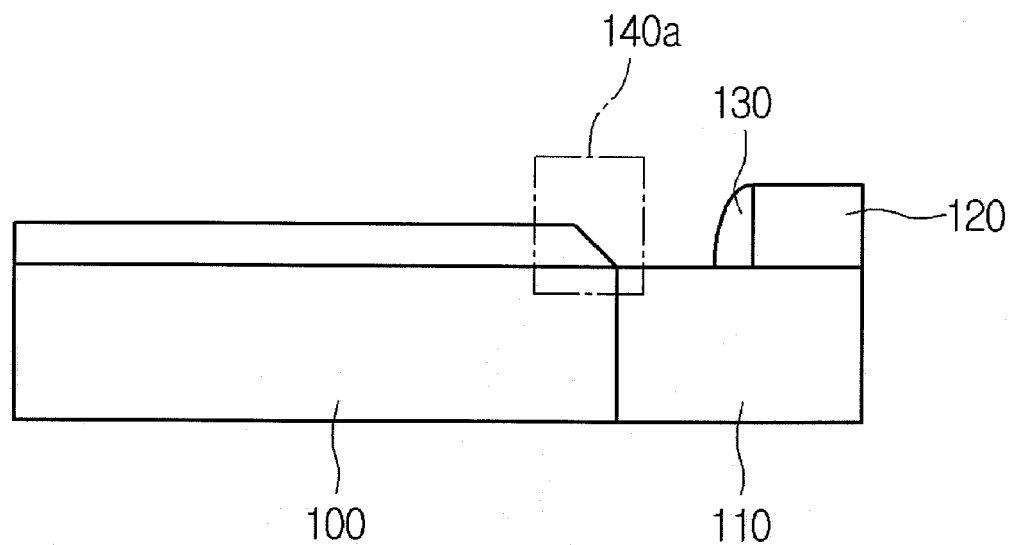

Referring to FIG. 1D, the silicide barrier layer 140 of the STI region 110, which is not covered by the photoresist, may be removed by a wet etching process. The wet etching process may be selected because it may improve process yield and quality. A p-MOS transistor is relatively sensitive, and a dry-etching plasma may damage the pixel region of an image sensor.

After wet-etching, the silicide barrier layer over an edge portion 140a of the pixel region 100 may be extremely thin or completely removed. Therefore, the edge portion of the pixel region 100 may be silicided again during a subsequent silicide process.

To avoid this, the silicide barrier layer 140 of the pixel region 100 may protrude toward a periphery region adjacent to the pixel region. However, a portion to be silicided, such as the polyline 120 of the select transistor, may be blocked, resulting in a partial failure in the silicidation of the polyline 120. This may result in an error in forming an image.

SUMMARY

Embodiments relate to a complementary metal oxide semiconductor (CMOS) image sensor and a fabrication method thereof. In embodiments, a boundary region of a silicide barrier layer of a pixel region in a CMOS image sensor may be protected from wet etching by using a nitride layer. The performance of the CMOS image sensor may be improved, as well as the fabricating method thereof.

Embodiments relate to a CMOS image sensor in which a device isolation region is sufficiently silicided and a boundary of a pixel region is not silicided to thereby improve the performance of the CMOS image sensor. Embodiments also relate to a CMOS image sensor fabrication method in which a polyline over a device isolation region is sufficiently silicided. A boundary of a pixel region is not silicided. Embodiments also relate to improving the performance of the CMOS image sensor.

In embodiments, a complementary metal oxide semiconductor (CMOS) image sensor may include a semiconductor substrate having a pixel region and a device isolation region adjacent to the pixel region. A polyline may be formed over the semiconductor substrate. A first type photodiode, doped with first type impurities, may be formed in the pixel region of the semiconductor substrate. A second type photodiode, doped with second type impurities, may be formed over the first type photodiode. A first nitride layer may be formed over a sidewall of the polyline. A second nitride layer may be formed over a boundary between the pixel region and the device isolation region, the second nitride overlapping the pixel region and the device isolation region by a predetermined length.

In embodiments, a method for fabricating a CMOS image sensor may include preparing a semiconductor substrate in which a device isolation region and a pixel region are defined and over which a polyline is formed. A first type photodiode may be formed by ion-implanting first type impurities into the pixel region of the semiconductor substrate. A second type photodiode may be formed at an upper portion of the first type photodiode by ion-implanting second type impurities into the first type photodiode. A nitride layer may be deposited over the semiconductor substrate. The nitride layer may be patterned to form a first nitride layer over a sidewall of the polyline and a second nitride layer overlapping the pixel region and the device isolation region. A silicide barrier layer may be deposited over the semiconductor substrate. The deposited silicide barrier layer is formed into patterns in the pixel region. A silicide process may be performed on the semiconductor substrate. The silicide barrier layer patterns may be removed from a periphery region and the device isolation region.

In embodiments, a method for fabricating a CMOS image sensor includes preparing a semiconductor substrate in which a device isolation region and a pixel region are defined and over which a polyline is formed. A first type photodiode may be formed by ion-implanting first type impurities into the pixel region of the semiconductor substrate. A first nitride layer, used as a spacer of the polyline, may be formed. A second nitride layer may be formed to overlap the pixel region and the device isolation region. A second type photodiode may be formed at an upper portion of the first type photodiode by ion-implanting second type impurities into the first type photodiode. A silicide barrier layer may be formed over the semiconductor substrate. The deposited silicide barrier layer may be formed into patterns in the pixel region. A silicide process may be performed on the semiconductor substrate. The silicide barrier layer patterns may be removed from a periphery region and the device isolation region by using a wet etching process.

DRAWINGS

FIGS. 1A to 1D are cross-sectional views illustrating a method for fabricating a related art CMOS image sensor.

Figure 2:
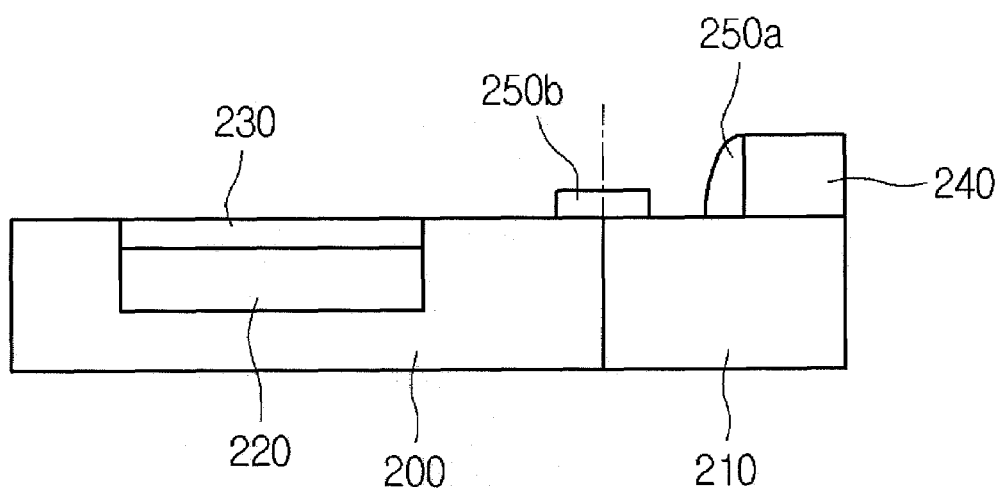

Example FIG. 2 is a cross-sectional view of a CMOS image sensor according to embodiments.

Example FIGS. 3A to 3E are cross-sectional views illustrating a method for fabricating a CMOS image sensor according to embodiments.

Figure 4:
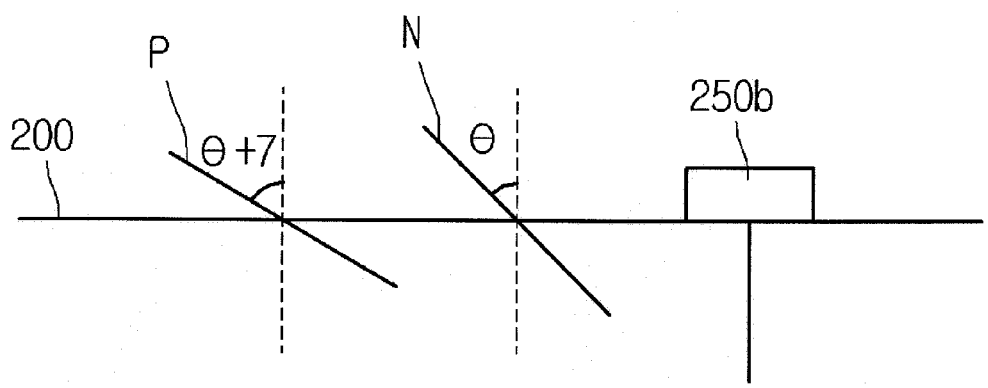

Example FIG. 4 is a schematic cross-sectional view illustrating an angled ion implantation process according to embodiments.

DESCRIPTION

Referring to example FIG. 2, a pixel region 200 formed over a semiconductor substrate is adjacent to a device isolation region 210. A polyline 240 formed over the substrate may include a first nitride layer 250a formed over a sidewall thereof. A second nitride layer 250b may be formed over a boundary between the pixel region 200 and the device isolation region 210. The second nitride layer 250b may extend toward both the pixel region 200 and the device isolation region 210 by a predetermined length.

The pixel region 200 may include an n-type photodiode 220 having n-type impurities, and a p-type photodiode 230 formed over the n-type photodiode 220 and having p-type impurities. The n-type impurities are herein referred to as first type impurities and the p-type impurities to as second type impurities.

The second nitride layer 250b protects an edge portion of the pixel region 200 during the silicidation of a periphery region. The second nitride layer 250b may overlap the pixel region 200 and the device isolation region 210 equidistantly by 0.2 µm from a boundary therebetween, which results in a 0.4 µm critical dimension.

Figure 3A:
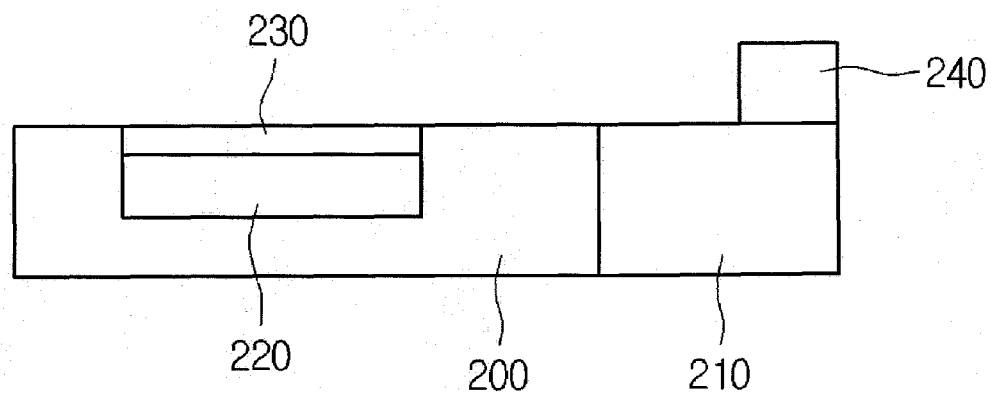

Referring to example FIG. 3A, first type impurities may be ion-implanted into a pixel region 200 adjacent to a device isolation region 210 to form an n-type photodiode 220. Thereafter second type impurities are ion-implanted into the n-type photodiode 220 to form a p-type photodiode 230 at an upper portion of the n-type photodiode 220.

Figure 3B:
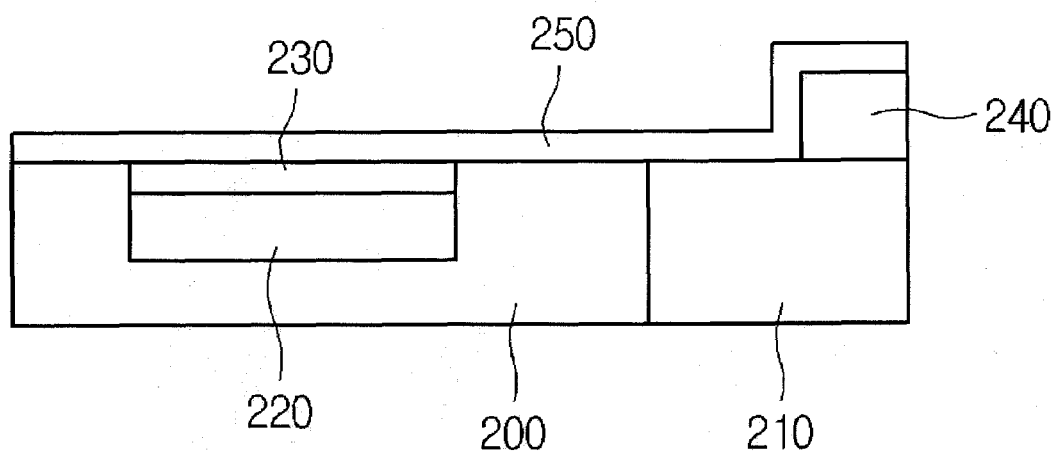
Figure 3C:
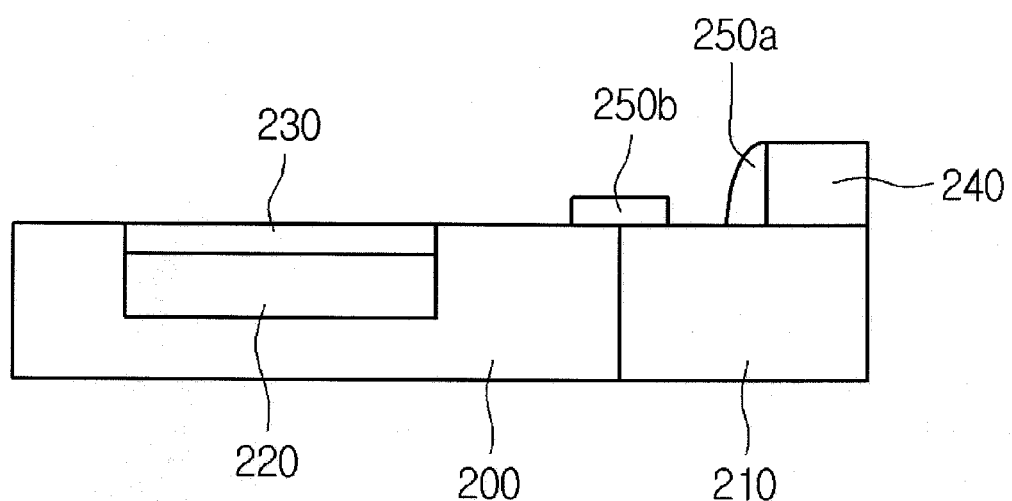

Referring to example FIG. 3B, a nitride layer 250 may be deposited over an entire surface of the substrate. Referring to example FIG. 3C, the nitride layer 250 may be patterned using a photolithography process to form a second nitride layer 250b over the boundary between the pixel region 200 and the device isolation region 210. The second nitride layer 250b may be formed together with a first nitride layer 250a, which may be used as a spacer of the polyline 240 formed in the periphery region 210.

In the first nitride layer patterning process, the second nitride layer 250b overlaps the pixel region 200 and the device isolation region 210 equidistantly by about 0.2 µm from the boundary therebetween, which results in about a 0.4 µm critical dimension.

Figure 3D:
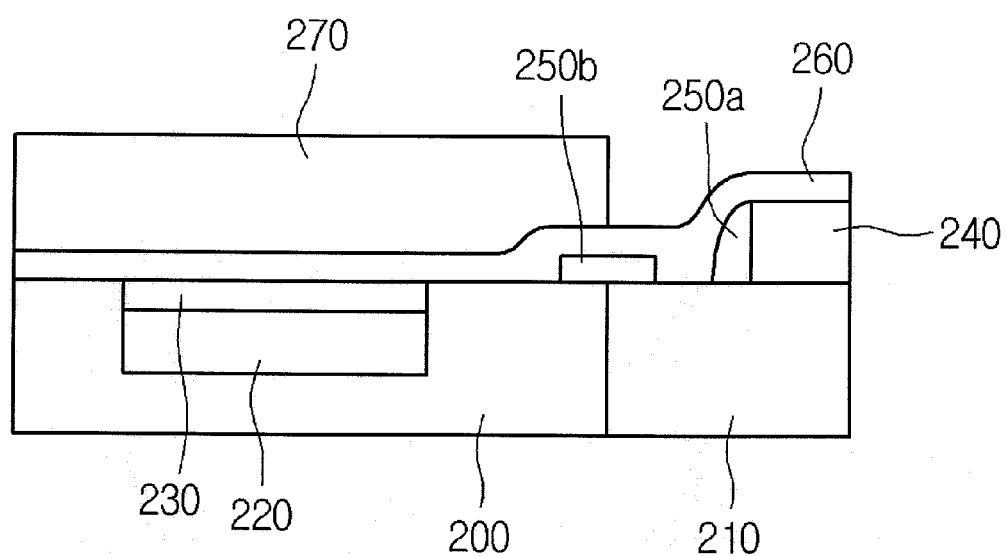

Referring to example FIG. 3D, a silicide barrier layer 260 may be deposited over the semiconductor substrate. The silicide barrier layer 260 may be formed of plasma-enhanced tetra-ethyl-ortho-silicate (PETEOS). The silicide barrier layer 260 may be deposited using an LPCVD or a PECVD. A photoresist layer may be coated over the silicide barrier layer 260 of the pixel region 200 and then the coated photoresist layer may be patterned to form a photoresist pattern 270 over the pixel region 200.

The second nitride layer 250b formed over the edge portion of the pixel region 200 protects the edge portion of the pixel region 200 from a silicide barrier layer etching process to be performed later. Hence, the photoresist pattern 270 does not need to excessively protrude toward the device isolation region 210 so as to protect the pixel region. Therefore, the photoresist pattern 270 may be formed closer to the pixel region 200 by about 0.1 µm.

Figure 3E:
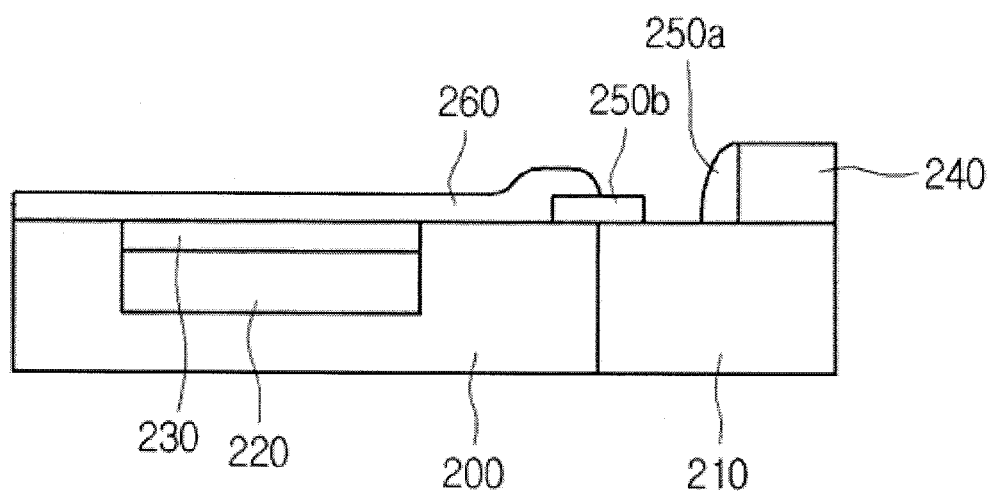

Referring to example FIG. 3E, the silicide barrier layer 260 of the device isolation region 210 may be removed by a wet etching process. Since an etching selectivity between the silicide barrier layer 260, which is an oxide layer, and the nitride layers 240a and 250b is relatively high, the second nitride layer 250b remains without being substantially etched. Hence, the silicide barrier layer 260 is relatively stably formed over the edge portion of the pixel region 200.

The nitride layer 250b may overlap the pixel region 200 and the device isolation region 210 by at least about 0.1 µm to 0.3 µm, or may overlap by 0.2 µm to 0.6 µm, from the boundary between the pixel region 200 and the device isolation region 210. When the minimum overlapping length is less than 0.2 µm, it may become difficult to protect the pixel region from etching depending on the processes used. When an overlapping length is longer than 0.6 µm, a region to be silicided on the semiconductor substrate is reduced, so that the device performance may be compromised, depending on the processes used.

In fabricating the CMOS image sensor, second type impurities may be implanted into a first type photodiode formed by ion-implanting first type impurities so as to improve the sensitivity of the photodiode. The second type impurities may be implanted before or after the formation of the second nitride layer 250b.

The forming of the second nitride layer 250b may present fewer issues when it is performed after the second type impurities are implanted. However, if the second nitride layer 250b is formed before the second type impurities are implanted, the second nitride layer 250b may block the second type impurities implanted towards the pixel region. Other embodiments lacking this issue will be described below in detail with reference to the accompanying drawings.

Referring to example FIG. 4, n-type impurities N may be implanted before forming the second nitride layer 250b. The n-type impurities N may be ion-implanted into a semiconductor substrate at an angel of θ degrees from a line perpendicular to an upper surface of a substrate. Where p-type impurities P are ion implanted after forming the nitride layer 250b, the p-type impurities P are implanted at an angle of about 7 degrees (θ+7) greater than the angle of θ degrees from the line perpendicular to the upper surface of the substrate, so that the p-type impurities P can be sufficiently ion-implanted into the semiconductor substrate formed below the nitride layer 250b.

Since other subsequent processes are substantially the same as those of the method described with reference to FIGS. 3A to 3E, their detailed description is omitted here.

As described above, in the CMOS image sensor according to embodiments, the boundary portion of the pixel region of the image sensor is protected from the silicidation process by using the nitride layer formed over the boundary portion. This may ameliorate, among others, issues with defective images, deteriorated quality and/or reduced yield related to the silicidation of the pixel region.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    preparing a semiconductor substrate in which a device isolation region and a pixel region are defined and over which a polyline is formed;
    forming a first type photodiode;
    forming a second type photodiode at an upper portion of the first type photodiode;
    depositing a nitride layer over the semiconductor substrate;
    patterning the nitride layer to form a first nitride layer over a sidewall of the polyline and a second nitride layer overlapping the pixel region and the device isolation region by a predetermined length from a boundary between the pixel region and the device isolation region;
    depositing a silicide barrier layer over the semiconductor substrate;
    patterning the deposited silicide barrier layer to form silicide barrier layer patterns in the pixel region;
    performing a silicide process on the semiconductor substrate; and
    removing the silicide barrier layer patterns from a periphery region and the device isolation region.

2. The method of claim 1, wherein said method is used to fabricate a complementary metal oxide semiconductor image sensor.

3. The method of claim 1, wherein said forming a first type photodiode comprises ion-implanting first type impurities into the pixel region of the semiconductor substrate.

4. The method of claim 1, wherein said forming a second type photodiode at an upper portion of the first type photodiode comprises ion-implanting second type impurities into the first type photodiode.

5. The method of claim 1, wherein the second nitride layer overlaps the pixel region and the device isolation region equidistantly by about 0.2 μm from the boundary between the pixel region and the device isolation region.

6. The method of claim 1, wherein the second nitride layer overlaps the pixel region and the device isolation region equidistantly from about 0.1 μm to 0.6 μm from the boundary between the pixel region and the device isolation region.

7. The method of claim 1, wherein the silicide barrier layer comprises plasma-enhanced tetra-ethyl-ortho-silicate.

8. A method comprising:
    preparing a semiconductor substrate in which a device isolation region and a pixel region are defined and over which a polyline is formed;
    forming a first type photodiode by ion-implanting first type impurities into the pixel region of the semiconductor substrate;
    forming a first nitride layer used as a spacer of the polyline;
    forming a second nitride layer overlapping the pixel region and the device isolation region by a predetermined length from a boundary between the pixel region and the device isolation region;
    forming a second type photodiode at an upper portion of the first type photodiode by ion-implanting second type impurities into the first type photodiode;
    forming a silicide barrier layer over the semiconductor substrate;
    patterning the formed silicide barrier layer to form silicide barrier layer patterns in the pixel region;
    performing a silicide process to the semiconductor substrate; and
    removing the silicide barrier layer patterns from a periphery region and the device isolation region by using a wet etching process.

9. The method of claim 8, wherein the second nitride layer overlaps the pixel region and the device isolation region equidistantly by 0.2 μm from the boundary between the pixel region and the device isolation region over each region.

10. The method of claim 8, wherein the second nitride layer overlaps the pixel region and the device isolation region equidistantly from about 0.1 μm to 0.6 μm from the boundary between the pixel region and the device isolation region.

11. The method of claim 8, wherein the second nitride layer remains without being substantially etched by the wet etching process.

12. The method of claim 8, wherein the silicide barrier layer comprises plasma-enhanced tetra-ethyl-ortho-silicate.

13. The method of claim 8, wherein, in the forming of the second type photodiode, an implantation angle of the second type impurities is 7 degrees greater than that of the first type impurities from a line perpendicular to a top surface of the semiconductor substrate.

* * * * *